United States Patent [19]
Val

[11] Patent Number: 4,654,694
[45] Date of Patent: Mar. 31, 1987

[54] ELECTRONIC COMPONENT BOX SUPPLIED WITH A CAPACITOR

[75] Inventor: Christian Val, St. Remy les Chevreuses, France

[73] Assignee: Compagnie d'Informatique Militaire Spatiale et Aeronautique, Paris, France

[21] Appl. No.: 634,433

[22] Filed: Jul. 26, 1984

[30] Foreign Application Priority Data

Jul. 29, 1983 [FR] France ............................... 83 12542

[51] Int. Cl.⁴ ............................................. H01L 23/02
[52] U.S. Cl. ................................. 357/74; 174/52 FP; 357/75; 361/321; 361/395; 361/401
[58] Field of Search ............... 174/52 FP; 357/51, 74, 357/75, 84; 361/401, 406, 408, 380, 392, 395, 399, 403, 321, 321 C

[56] References Cited

U.S. PATENT DOCUMENTS 3,374,400  9/1965  Tabuchi et al. ..................... 357/80
3,555,364  1/1968  Matcovich .......................... 357/75
3,569,872  3/1971  Berlin ............................. 361/321 C
4,249,196  2/1981  Durney et al. ...................... 357/74
4,356,529 10/1982  Kopel .............................. 361/321 C
4,454,529  6/1984  Philofsky et al. ................... 357/51
4,539,622  9/1985  Akasaki ............................ 361/401
4,580,157  4/1986  Honda ............................. 357/74

FOREIGN PATENT DOCUMENTS 0046548  4/1981  Japan .............................. 357/84
0129348 10/1981  Japan .............................. 357/74
2091035  7/1982  United Kingdom .

OTHER PUBLICATIONS

Patents Abstracts of Japan, vol. 6, No. 6(E-89) (884), Jan. 14, 1982, & JP-A-56 129 348 (Nippon Denki K.K.) 09-10-1981.

Primary Examiner—James W. Davie
Attorney, Agent, or Firm—Oblon, Fisher, Spivak, McClelland & Maier

[57] ABSTRACT

An electronic box having a capacitor in the form of a supporting plate bearing a component and covered by a cap. Additionally, the box includes a capacitor connected onto the supporting plate in such a way as to be situated between the component and the cap.

7 Claims, 7 Drawing Figures

FIG_1-a
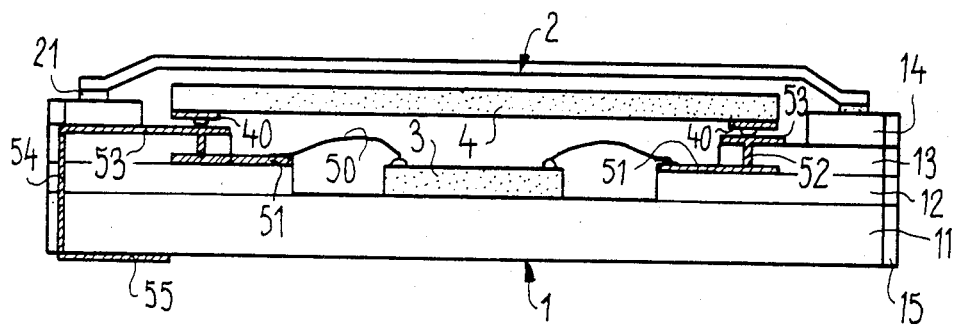
FIG_1-b
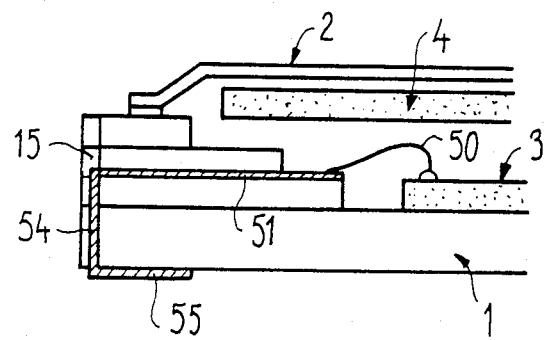

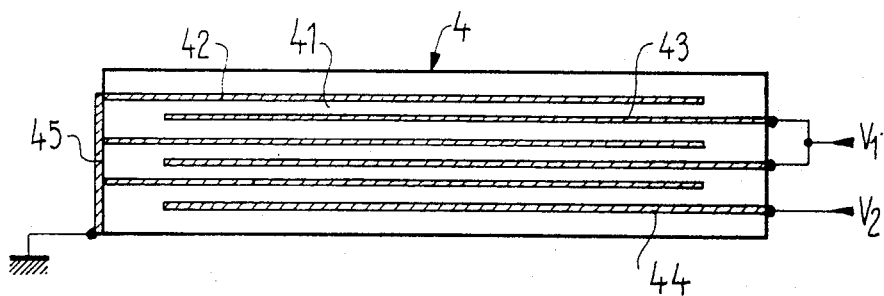
FIG_2-a
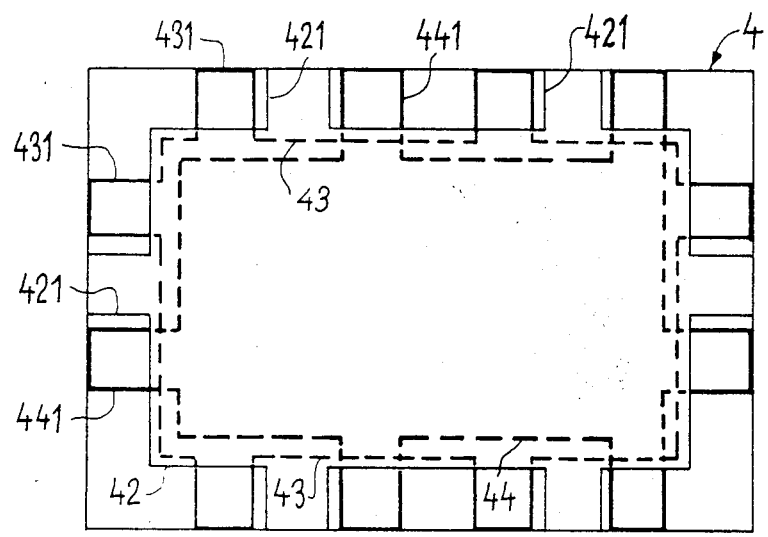
FIG_2-b

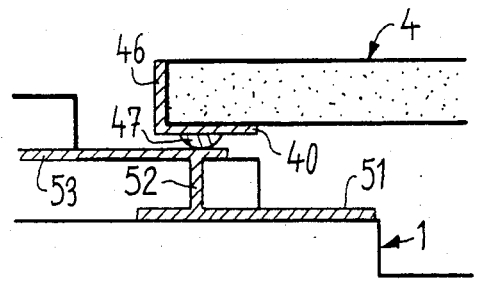
FIG_3-a
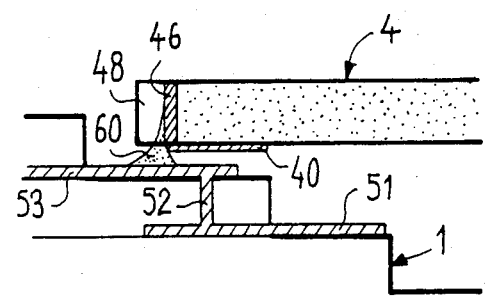
FIG_3-b
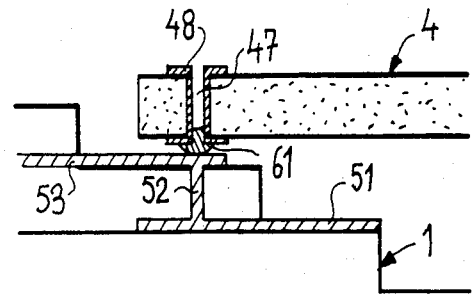
FIG_3-c

ELECTRONIC COMPONENT BOX SUPPLIED WITH A CAPACITOR

BACKGROUND OF THE INVENTION

1. Field of the Invention

The invention concerns a case or box comprising a supporting plate carrying a circuit or an electronic component, covered by a cap, the carrier also including a capacitor.

2. Discussion of Background

In the present specification, a component is understood to be any active or passive component, discrete or integrated, as well as any electronic circuit (hybrid circuit, for instance) likely to be placed in the box.

As is well known, it frequently happens that a component or electronic circuit requires one or several auxiliary capacitors, especially for decoupling, which cannot be integrated onto the same substrate as the component in question. The capacitors are therefore added onto the printed circuit card which bears the component and its box, which occupies a considerable area of the surface in proportion to that occupied by the component. This is in direct contrast to the need to increase the density presently available.

In order to reduce this difficulty, it is known, in accordance with the French Patent Application No. 79 11852, in the name of THOMAS-CSF, that the supporting plate of the box may be used to create a capacitor. To this end, a ceramic plate is selected which constitutes the dielectric element of the capacitor overlayed by the necessary metallizations to provide the armatures of this capacitor. However, this solution is unsuitable for certain applications, notably those which use power components or have a high integration factor. Indeed, the supporting plate of a box presents special thermal properties, including a coefficient of thermal expansion which is as close as possible to that of the semiconductor material employed, this most frequently being silicon, which generally results in alumina being chosen for the supporting plate. Another property which the supporting plate must have is a good thermal conduction for discharging the calories. These various requirements are not necessarily compatible with the embodiment of a capacitor, mainly as regards the dielectric constant of the supporting plate and the appearance of disturbing capacitive couplings between the circuit connections and those of the capacitor.

A second structure has been proposed and described in the French Patent Application 82 11402 in the name of CIMSA, in which the supporting plate presents a structure which is thermally optimized, the capacitive function being embodied on or inside the cap of the carrier. This structure, if it enables the previous problems to be avoided, does however lead, in certain cases, to difficulties in realization due to the fact that, at the time of fixing the cap onto the supporting plate, it is necessary to both seal the cap on the supporting plate together and make the electrical connections of the capacitor with the remainder of the circuit. In addition and is as well known, present components tend to process signals whose voltage is lower and lower with faster and faster response times. Consequently these circuits, it is necessary to reduce as far as possible the impedance of component-capacitor interconnections which, it will be recalled, is proportional to the square root of the ratio L/C. For this purpose, it is necessary to reduce the inductance L of these connections, which is carried out by reducing their length. For certain applications, it may be desirable to further reduce this impedance relatively to that which is obtained for a structure of the type described in the previously quoted patent application 82 11402.

SUMMARY OF THE INVENTION

The object of the present invention is a box or case which includes a capacitor and which enables a response to be provided to these requirements, this being due to the fact that the capacitive function is embodied by means of a discrete component placed above the electronic component and inside its box.

More precisely, according to the invention, an electronic component box, consisting of a supporting plate on which are fixed the component and a cap, includes in addition at least one capacitor placed between the component and the cap and electrically connected to the supporting plate.

BRIEF DESCRIPTION OF THE DRAWINGS

Other objects, characteristics and results of the invention will arise in the description which follows, illustrated by the attached figures which represent:

FIG. 1a, general schematic section of an embodiment of the box according to the invention and FIG. 1b, a partial section view of another part of this box;

FIGS. 2a and 2b show respectively a section and topview of an embodiment of the capacitor placed inside the box according to the invention;

FIGS. 3a, 3b and 3c show three realization variants of the electrical connection mode of the capacitor placed in the box, according to the invention.

DETAILED DESCRIPTION OF THE PREFERRED EMBODIMENTS

On these various figures, on the one hand the same references refer to the same elements and, on the other hand, the actual scale has not been observed for report clarity.

In FIG. 1a, a box or case is therefore represented for the encapsulation, for instance, of an integrated electronic circuit embodied on a chip 3 made of semiconductor material, silicon for instance. This box chiefly consists of a supporting plate 1 carrying the component 3, a cap 2 fixed onto the supporting plate 1 in such a way as to hermetically seal the component 3, and the capacitor 4 placed inside the carrier.

As an example, a box of special type is represented, known under the name of "chip carrier" and which presents the characteristic feature of lacking connection pins, which are replaced by simple metallization 55 on the lower part of the supporting plate 1.

The supporting plate 1 is made of a material which must be rigid, preferably an electrical insulator and offering certain thermal qualities, in such a way that has been mentioned above, i.e. principally presenting a good thermal conduction and a coefficient of expansion as close as possible to that of the circuit 3; the supporting plate therefore can, for example, be made of plastic, glass, ceramic material, etc.; in the case most often encountered in practice where the circuit 3 is in silicon, the supporting plate can usefully be in alumina. The supporting plate in this example consists of four distinct parts, respectively marked 11, 12, 13 and 14. The first part 11 is in the form of a board and supports the component 3; the three other parts are each made up of a ring, each of which is concentric and arranged one above the other around the component 3 with an increasing internal diameter and in such a way as to provide room for electrical connections between the component, the capacitor 4 and the outside. The component 3 is thus fixed onto the upper face of the board 11, for example by soldering on a not shown metallization.

Connections are realized in the following way. The connection points of the component 3 are each linked by conductors, such as 50, to the conductor tracks 51 laid out on the upper part of the first ring 12 of the supporting plate 1. These tracks 51 are connected to the rest of the device in three different ways, according to their function:

- in an initial way, illustrated for example in the left part of FIG. 1a, the tracks 51 lead to conductor pits 52, completely passing through the ring 13 and realizing the electrical connections between the tracks 51 and those tracks 53 borne by the upper surface of the ring 13; the capacitor 4 is supplied with the connections 40 which are also connected to the tracks 53; the tracks 53 lead to half-holes 15 substantially in the form of semi-cylinders embodied in the thickness of the supporting plate 1 at its periphery, holes in which the marked connections 54 link them to the connections 55 of the box; this first connection mode has the dial function of supplying the capacitor 4 from the outside and of then leading to the component 3 the energy stored inside the capacitor;
- the second method, illustrated as an example on the right part of the FIG. 1a, in which the tracks 51 are, as previously, linked to the connections 40 of the capacitor 4 by means of pits 52 and tracks 53 but here the tracks 53 are not connected to the outside of the box; this connection mode has the sole function of supplying the component 3 with the energy stored inside the capacitor 4;
- the third method is illustrated in FIG. 1b where the box fraction affected by the connections has been represented; the tracks 51 are not linked here to the capacitor 4 but abut onto the connections 55 of the box by means of the connections 54 and half-holes 15; this mode of operation has the function of transmitting signals other than the power supplies $V_1$, $V_2$ and the ground between the component and the outside.

The tracks and connections 51 to 55 are made, for instance, of a heat-resisting metal basis (tungsten, for instance).

On the supporting plate 1, it is known that a cap such as 2 is fixed which is intended to hermetically seal the circuit 3. This cap can be metallic or insulating, embodied or not, with the same material as the supporting plate 1. It is fixed onto the supporting plate by means of a joint 21; in the case where the supporting plate and cap are made of ceramic, the joint is a glass sealing or a soldering seam.

FIGS. 2a and 2b represent respectively a section and a topview of a an embodiment for the capacitor 4 of FIG. 1.

In FIG. 2a, the capacitor 4 embodied in this example has therefore been represented according to the known technology of multilayered capacitors, i.e. dielectric plates 41 with high dielectric constant are arranged alternately and constituted, for example, by a dielectric material adapted to high frequencies of type I (NPO classification) and metallization foring armatures, marked 42, 43 and 44, carried out, for instance, in silver-palladium, the resulting capacitor 4 being for example visibly in the form of a square or rectangular parallelepiped. As an example, metallization of odd ranks (beginning with the upper face of the capacitor) are marked 42 and linked by a common connection 45 laid down on the lateral part of the capacitor 4 so as to connect them to the ground; connections of even ranks are linked to one or, as the example in the figure, to several given voltages, for instance the electrodes 43 (two in number of the figure) to a first voltage $V_1$ and one electrode 44 to a second voltage $V_2$. In this way, two capacitors are obtained.

An example of the disposition of the various plates of FIG. 2a is shown in FIG. 2b. In this figure, it can be seen that the ground metallizations 42 have dimensions slightly less than those of the capacitor 4 and extend through the flat pin terminals 421 towards the periphery of the capacitor. In the same way, the metallizations 43 linked to the voltage $V_1$ are supplied with flat pin terminals 431 placed as near as possible to the ground terminals 421 and in equal number. Finally, the metallizations 44 are linked to the second voltage $V_2$ also include terminals marked 441 and equal in number to the previous ones, these terminals being included in such a way as to form groups of three terminals 421, 431 and 441 in a number as large as necessary for the distribution of energy from the capacitor 4 to the component 3.

A structure has also been embodied in which the ground connections and the two voltages $V_1$ and $V_2$ are distributed along the perphery of the capacitor 4 enabling the inductance of inputs-outputs to be reduced since the ground connection is placed between the power supply connections, and as close as possible to the latter.

FIGS. 3a, b and c represent three variants of the electrical connection embodiments of the capacitor 1 with the track 53 of the supporting plate 1 of the box according to the invention.

In FIG. 3a, an extremity of the capacitor 4 is thus represented with a lateral connection 46 linking the ground electrodes, or one of the voltages $V_1$ or $V_2$ to the connection 40 of the capacitor, as well as one part of the system of tracks 51, 52 and 53 of the box.

According to this first variant, the electrical connection is made using a connection piece 47 made on the connection 40 of the capacitor by silk screen deposit, for instance, of a glass layer (not represented) on the electrode 40 and the lower face of the capacitor 4 except as regards the connecting piece 47, then a deposit of a tin-lead layer on the part left free.

FIG. 3b also represents connections 51 to 53 of the supporting plate 1 and the capacitor 4.

The connection 46 of the capacitor 4 is, in this case, carried out inside a half-hole 48 in a manner analogous to the connections 54 of the supporting plate 1 (FIG. 1). In this variant, the connection of the capacitor 4 is carried out by soldering 60 between the connection 53 of the supporting plate and the connection 46 of the capacitor.

FIG. 3c also represents connections 51 and 53 of the supporting plate 1 and the capacitor 4. Passages are embodied such as 47, metallized 48 on their periphery, facing the terminals 421, 431 and 441 (FIG. 2b) of the metallizations of the capacitor 4. The metallized hole 47–48 is connected to the connection 53 by a weld seam 61.

The box or carrier which has just been described comprising a capacitor placed above the component and connected to the supporting plates, presents a certain number of advantages amongst which, apart from the characteristics already mentioned, can be cited the following:

- the short length of the capacitor connections to the component which enables to reduce their impedance;
- the fact that the distribution points (such as represented to the right of FIG. 1a) distributed along the periphery of the capacitor 4 constitute as many connections as are not necessary for issuing out of the box. Indeed, the capacitor 4 is supplied from outside (ground, $V_1$, $V_2$) in several points (first connection mode) for example from 2 to 10, by a component with 250 outputs and it provides an energy distribution function to the component 3 through the numerous connections (from 50 to 100 in the previous example) which consequently do not all have to pass through the box (second connection mode);
- the technological implementation facility (choice of materials, operational conditions, ageing) due to the separation of sealing/capacitor connection functions;
- the test possibility of the component and its capacitor prior to sealing of the box which allows repairing.

The above description has been supplied as a non limiting example and thus the plate 4 has been described as comprising a capacitor realized by the multilayer technique (FIG. 2); the plate 4 can, in an embodiment variant, be an insulating substrate carrying one or several discrete capacitors; these capacitors, in one or other of the realization modes (multilayered or discrete) are likely to be used as much for a decoupling function (several hundreds of nanofarads, for example) as for an energy reserve function (in the order of 1F), for example; in addition, the multilayered capacitor has been represented with coatings parallel to the supporting plate but these can be perpendicular to it. Moreover, a plate such as 4 can include other active or passive capacitors, such as inductances resistors, or auxiliary batteries. Equally, the internal connections of the capacitors 4, in the case where this involves a multilayered capacitor, do not have to be embodied along the periphery of the capacitor but may be on any point of it. Finally, in FIG. 1 a box is represented of the four stage chip-carrier type, but the invention can be applied to any type of standard box supplied with connection pins and with any number of stages whatever, the only condition being to avoid any electrical contact between the surface of the component and that of the capacitor and the cap, at least when the latter is metallic. In this conception, the presence of ring 12 is not absolutely essential; ring 13 can be replaced by a ring interdependent of the capacitor 4 and ring 14 by a ring interdependent of the cap 2.

I claim:

1. An electronic component box comprising:
   an electronic component;
   a base bearing said component;
   a cover fixedly sealed on said base;
   a multilayer capacitor, positioned in said box between said component and said cover wherein said capacitor is supported on said base; and
   at least three pads for connecting said multilayer capacitor to said base wherein said pads are positioned so that currents are able to flow in opposite directions in adjacent ones of said at least three pads.

2. A box according to claim 1, wherein said multilayer capacitor includes at least two superimposed separate capacitors connected to ground and respectively to at least two distinct voltages $V_1$, $V_2$.

3. A box according to claim 1, wherein said multilayer capacitor has a plurality of armatures and wherein each of the capacitor armatures present a flat pin terminal extending to the periphery of the capacitor so that terminals of the armature are electrically linked one above the other.

4. A box according to claim 1, wherein said box has a plurality of terminals in which said terminals are linked through a plurality of metallized holes.

5. A box according to claim 1, wherein said base includes at least one plate and three concentric rings placed one above the other on the plate and around said component with an increasing internal diameter, wherein the connections of said component are connected to first conductor tracks carried by a first one of said three rings, the connections of said capacitor being connected to second conductive tracks carried by a second one of said three rings, the first or second tracks passing outside the box, connection means crossing said second ring in order to link the first and second conductor tracks, said cover being fixed onto a third one of said rings.

6. A box according to claim 1, in which the electrical connections are placed in the periphery of the said capacitor.

7. The box according to claim 1 wherein said electronic component is an Integrated Circuit (IC).

* * * * *